United States Patent [19]
Hamaguchi

[11] Patent Number: 6,028,458
[45] Date of Patent: Feb. 22, 2000

[54] DIFFERENTIAL AMPLIFIER WITH INPUT SIGNAL DETERMINED STANDBY STATE

[75] Inventor: Kunihiko Hamaguchi, Kanagawa, Japan

[73] Assignee: NEC Corporation, Tokyo, Japan

[21] Appl. No.: 09/010,579

[22] Filed: Jan. 22, 1998

[30] Foreign Application Priority Data

Jan. 30, 1997  [JP]  Japan ................................. 9-016786

[51] Int. Cl.[7] ............................................ H03K 5/153
[52] U.S. Cl. ............................ 327/89; 327/62; 327/74; 365/226
[58] Field of Search ................................. 327/77, 89, 74, 327/80, 81, 51, 52, 53, 58, 62; 365/226, 227, 228, 229

[56] References Cited

U.S. PATENT DOCUMENTS

| | | | |
|---|---|---|---|
| 5,077,491 | 12/1991 | Heck et al. | 327/74 |
| 5,159,211 | 10/1992 | Fujii | 327/65 |
| 5,557,221 | 9/1996 | Taguchi et al. | 327/77 |
| 5,642,063 | 6/1997 | Lehikoinen | 327/74 |
| 5,726,592 | 3/1998 | Schulte et al. | 327/77 |
| 5,834,974 | 11/1998 | Kim | 327/52 |
| 5,859,526 | 1/1999 | Do et al. | 330/279 |

FOREIGN PATENT DOCUMENTS

| | | | |
|---|---|---|---|
| 63-281516 | 11/1988 | Japan | H03K 19/00 |
| 2-265098 | 10/1990 | Japan | G11C 11/419 |
| 6-260845 | 9/1994 | Japan | H03F 1/02 |

Primary Examiner—Timothy P. Callahan
Assistant Examiner—Terry L. Englund
Attorney, Agent, or Firm—Young & Thompson

[57] ABSTRACT

An input first stage circuit performing switching between activation and inactivation in response to an input signal includes a differential amplifier for comparing the input signal with a reference voltage and a switching transistor for receiving a power supply disconnection signal to control the power supplied, and a level detection circuit including a low level standby detector for detecting a low level of the input signal and a high level standby detector for detecting a high level of the input signal. Each of the standby detectors includes an input stage transistor to which the input signal is inputted, the low level standby detector produces a power supply disconnection signal for stopping the power supplied to the differential amplifier when the detected level of the input signal is lower than the threshold voltage of the input stage transistor; the high level standby detector produces another power supply disconnection signal when the detected level of the input signal is higher than the level of a difference voltage of the threshold voltage of the input stage transistor from the power supply voltage.

7 Claims, 6 Drawing Sheets

DIFFERENTIAL AMPLIFIER WITH INPUT SIGNAL DETERMINED STANDBY STATE

BACKGROUND OF THE INVENTION

1. Field of the Invention

This invention relates to an input first stage circuit, and more particularly to a current consumption reduction countermeasure for an input first stage circuit when a semiconductor device is in a standby state.

2. Description of the Related Art

Generally, an input first stage circuit of a semiconductor device is composed of a differential amplifier and several switches and has a differential amplifying action of an input signal and a current consumption reducing action when the semiconductor device is in a standby state.

Figure 1A:
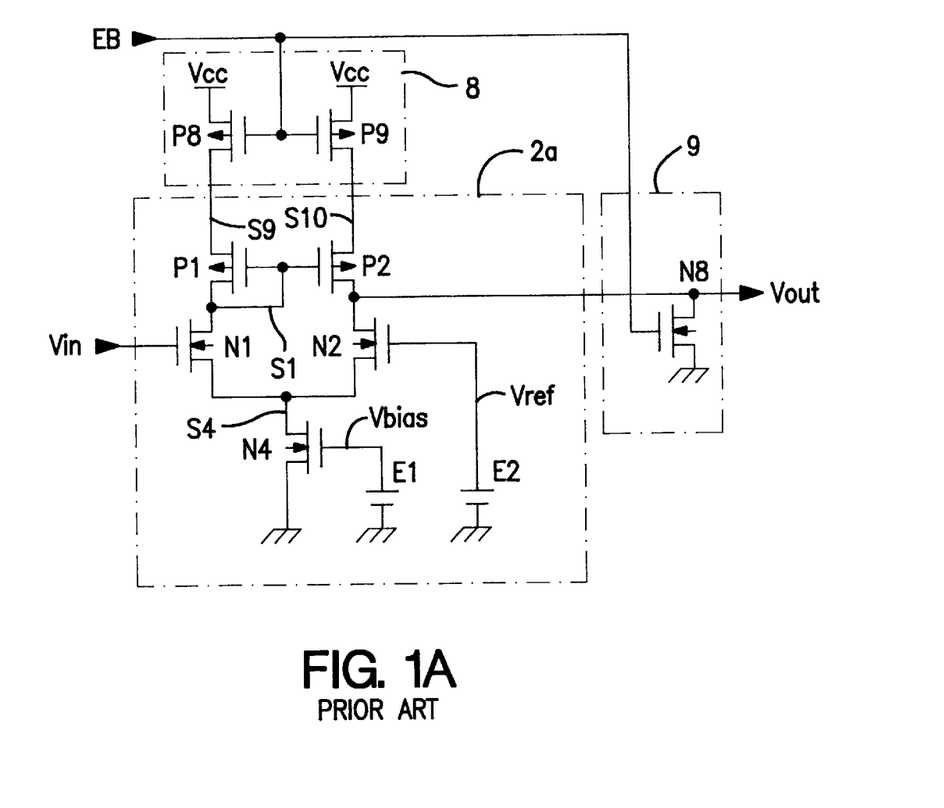
FIG. 1(a) is a circuit diagram of a form of a conventional input first stage circuit.

An example of a conventional input first stage circuit is shown in FIG. 1(a). The input first stage circuit shown includes an differential amplifier 2a for comparing an input signal Vin with a reference voltage Vref and amplifying a voltage difference between them, a first switch circuit 8 for controlling current supply to the differential amplifier 2a, and a second switch circuit 9 for settling an output Vout of the differential amplifier 2a.

The differential amplifier 2a is a CMOS which includes N-channel MOS transistors (hereinafter referred to as NMOS) N1 and N2 to which the input signal Vin arid the reference voltage Vref are supplied, respectively, P-channel MOS transistors PMOS P1 and P2 which form a current mirror circuit, and an NMOS N4 which operates as a constant current source with a constant voltage bias supplied to the gate thereof.

The first switch circuit 8 includes PMOS P8 and P9 connected additionally to the differential amplifier 2a for stopping current supply to the differential amplifier 2a when an activation signal EB is supplied to the gates thereof. The second switch circuit 9 includes an NMOS N8 for fixing the level of the output Vout to a low level while current supply to the differential amplifier 2a remains stopped. Further, a signal S1 in FIG. 1(a) represents a gate control signal to the PMOS current mirror, a signal S4 represents a common contact signal of the differential amplifier 2a, and signals S9 and S10 represent power supply signals to the differential amplifier 2a.

Figure 1B:
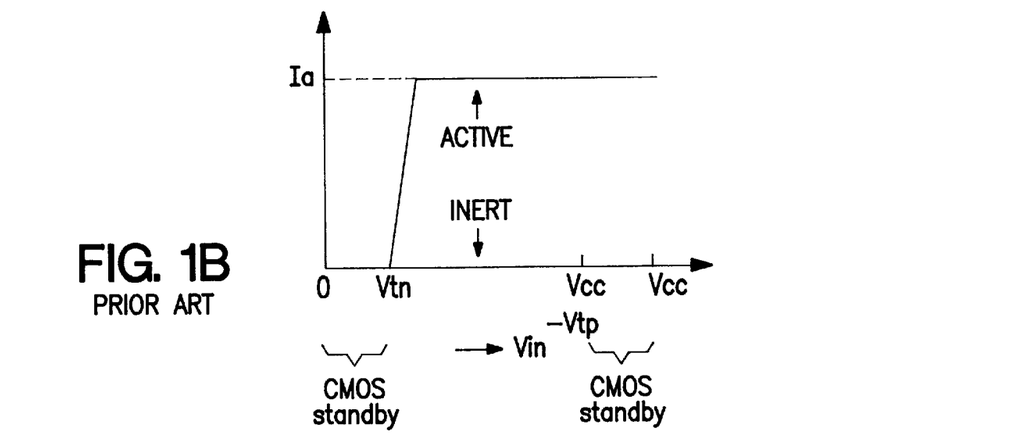
FIG. 1(b) is a diagram illustrating an input signal-current consumption characteristic of the input first stage circuit.

An input voltage-current consumption characteristic illustrated in FIG. 1(b) indicates normalized current consumption with respect to the voltage Vin of the input signal when the input first stage circuit is active and inactive. Here, Vcc denotes a power supply voltage, Vtn a threshold voltage of the NMOS, and Vtp a threshold voltage of the PMOS. Further, a state when the voltage Vin of the input signal is lower than Vtn or falls within a range higher than a difference value (Vcc−Vtp) of the threshold voltage Vtp of the PMOS from the power supply voltage Vcc but is equal to or lower than Vcc is hereinafter referred to as standby state, that is, CMOS standby state. The standby state of a CMOS is conventionally known as a technique for reducing the current consumption of an input first stage circuit of a semiconductor device and controlling the current consumption of the entire semiconductor device to a low value, and is used widely, for example, to increase the backup time by a battery in a portable appliance and so forth.

When the activation signal EB is at the low level which indicates activation, the first switch circuit 8 exhibits an on state and differential amplifier 2a outputs a high level at the output signal Vout if the level of the input signal Vin is higher than the reference voltage Vref, but outputs a low level conversely if the level of the input signal Vin is lower than the reference voltage Vref. The current consumption however depends upon the level of the input signal Vin as seen from FIG. 1(b). More particularly, when the level of the input signal Vin is lower than the threshold value Vtn of the NMOS, the current consumption is zero, but when the level of the input signal Vin is higher than the threshold value Vtn of the NMOS, the current consumption has a current value equal to or lower than a steady current value Ia of the NMOS N4 which operates as a constant current source.

On the other hand, when the activation signal EB is at the high level which indicates inactivation, the first switch circuit 8 exhibits an off state while the second switch circuit 9 exhibits an on state. Consequently, the output Vout exhibits the low level irrespective of the level of the input signal Vin. The current consumption in this instance is zero.

In the input first stage circuit which operates in such a manner as described above, whereas the current consumption in the CMOS standby state when the Vin less than Vtn is zero, the current consumption in the CMOS standby state when Vin is greater than Vcc−Vtp is Ia. In order to reduce the current consumption, the activation signal EB is controlled to inactive, i.e., at a high level. However, when the activation signal EB should be rendered inactive depends not upon the input signal Vin but upon a different signal, and actually, the different signal is produced by a circuit which operates precedently in time to the input first stage circuit.

As a concrete example of a current consumption reduction countermeasure in such a standby state as described above, a first stage circuit formed from a general purpose DRAM for a semiconductor memory device is described.

Figure 2A:
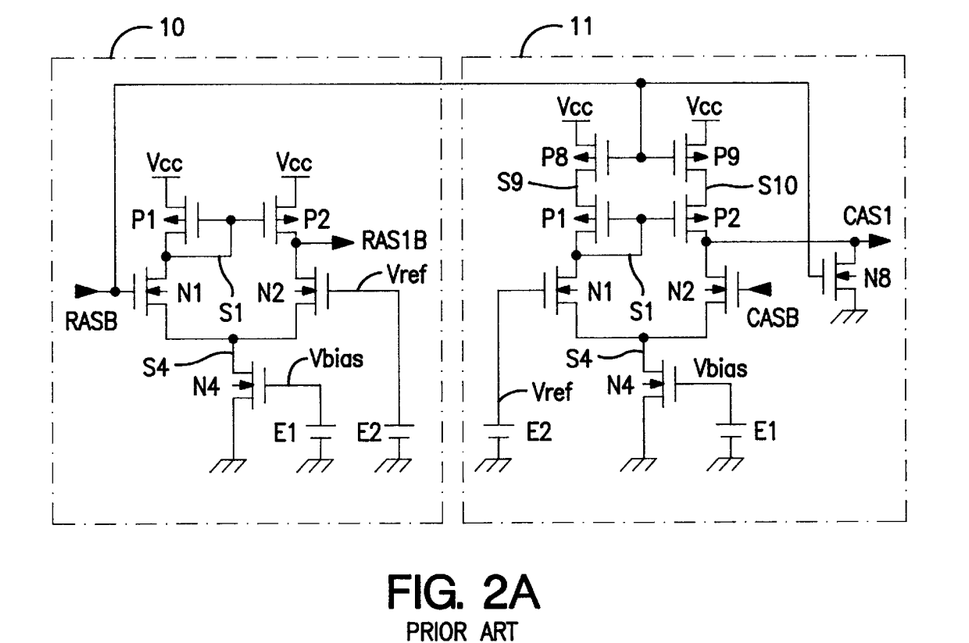
FIG. 2(a) is a circuit diagram showing a detailed example of the conventional circuit shown in FIG. 1(a)
Figure 2B:
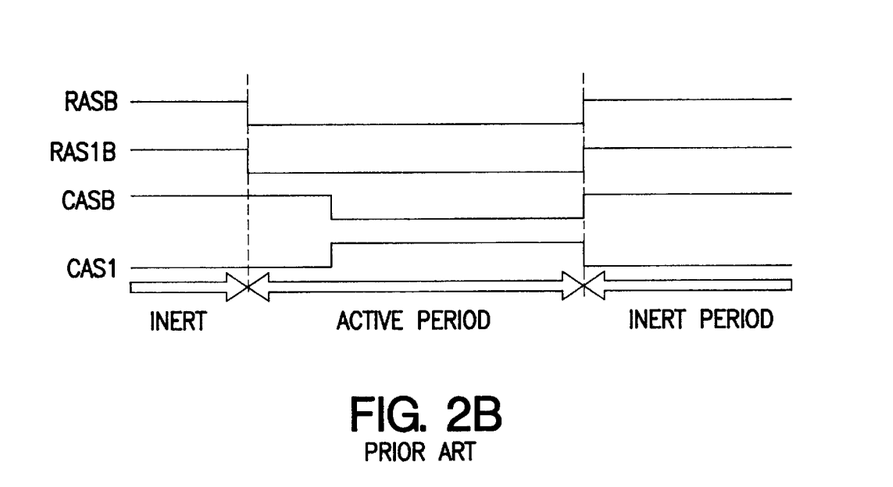
FIG. 2(b) is a timing chart illustrating timings of several signals of the circuit.

FIGS. 2(a) and 2(b) are a circuit diagram of the input first stage circuit and a timing chart of several signals of the input first stage circuit showing details of those of FIGS. 1(a) and 1(b), respectively. The general purpose DRAM includes, as seen in FIG. 2(a), a first stage circuit 10 for an inverted row address strobe signal (hereinafter referred to as RASB signal) and a first stage circuit 11 for an inverted column address strobe signal (hereinafter referred to as CASB). The RASB first stage circuit 10 is formed from a differential amplifier corresponding to the differential amplifier 2a of FIG. 1(a) described hereinabove. Meanwhile, the CASB first stage circuit 11 corresponds to the entire input first stage circuit for current consumption reduction in the standby state of FIG. 1(a). However, the RASB is inputted in place of the activation signal EB described hereinabove.

Since the general purpose DRAM which includes the RASB first stage circuit 10 and the CASB first stage circuit 11 in this manner exhibits a standby state while the RASB signal is high as seen from FIG. 2(b), the CASB signal is varied to the low level to perform a writing/reading operation within a period within which the RASB signal has the low level. During the period during which the RASB signal is high, the first stage circuit 11 need not operate and is rendered inactive by the RASB signal so that the current consumption in the standby state is reduced. On the other hand, the RASB first stage circuit 10 does not have another signal which controls activation/inactivation of the first stage circuit 10 itself since the RASB signal makes a reference to the entire first stage circuit 10, and consequently, the current consumption of the first stage circuit 10 in the standby state cannot be reduced.

The input first stage circuit of FIG. 1(a) described above has a problem in that it requires the activation signal EB and several switch circuits which are controlled by the activation signal EB in order to reduce the current consumption in the standby state and also in that another signal for controlling the activation signal must be prepared.

On the other hand, the input first stage circuits of FIG. 2(a), particularly the RASB first stage circuit 10, has a problem in that, since the RASB signal is used as a reference signal, a signal for controlling the first stage circuit 10 to active/inactive cannot be acquired from another circuit, and consequently, such a first stage circuit which reduces the current consumption in the standby state as described above with reference to FIGS. 1(a) and 1(b) cannot be adopted. Meanwhile, the CASB first stage circuit 11 is disadvantageous in that an external activation signal such as the RASB signal is required for activation/inactivation control and that, in order to obtain such an activation signal as just mentioned, the timings with which an active period and an inactive period of the RASB first stage circuit are controlled must be designed accurately, and consequently, the CASB first stage circuit itself is complicated.

SUMMARY OF THE INVENTION

It is an object of the present invention to provide an input first stage circuit which eliminates the problems described above and can reduce the current consumption in the standby state with a simple circuit construction without using another activation signal independent of an input signal.

According to the present invention, an input first stage circuit for a semiconductor device comprises a differential amplifier for comparing an input signal with a reference voltage and amplifying a voltage difference between the input signal and the reference voltage, and a level detection circuit for detecting a predetermined voltage level of the input signal to produce a power supply disconnection signal for the differential amplifier so that the power supplied to the differential amplifier is stopped while the level detection circuit produces the power supply disconnection signal.

Further, the differential amplifier of the input first stage circuit of the present invention includes differential pair transistors for comparing the input signal with the reference voltage, and a switching transistor for receiving the power supply disconnection signal to control the power supply, and is switched between active and inactive based on the input signal.

Furthermore, the level detection circuit of the input first stage circuit of the present invention includes a low level standby detector for detecting a low level of the input signal and a high level standby detector for detecting a high level of the input signal, each of the low level standby detector and the high level standby detector including an input stage transistor to which the input signal is inputted, and the low level standby detector detects that the level of the input signal is a low level lower than the threshold voltage of the input stage transistor while the high level standby detector detects that the level of the input signal is a high level higher than the level of a difference voltage of the threshold voltage of the input stage transistor from the power supply voltage so that when one of the levels is detected the power supplied to the differential amplifier is disconnected.

Further, the level detection circuit in the present invention produces a power supply disconnection signal in accordance with a voltage value which depends upon the threshold voltage of the input stage transistor.

The input first stage circuit of the present invention has an effect in that, by the means and method described above, active and inactive states of the input first stage circuit of itself can be controlled, and even where it is applied as a first stage circuit of a signal which makes a reference to an entire device such as a RASB signal of a general purpose DRAM, when the input signal is in a standby state, the power consumption can be reduced.

Further, since a signal for controlling the input first stage circuit between active and inactive is produced by the level detection circuit, switching control between active and inactive can be performed simply.

The above and other objects, features, and advantages of the present invention will become apparent from the following description and referring to the accompanying drawings which illustrate and explain of a preferred embodiment of the present invention.

DESCRIPTION OF THE PREFERRED EMBODIMENTS

Figure 3A:
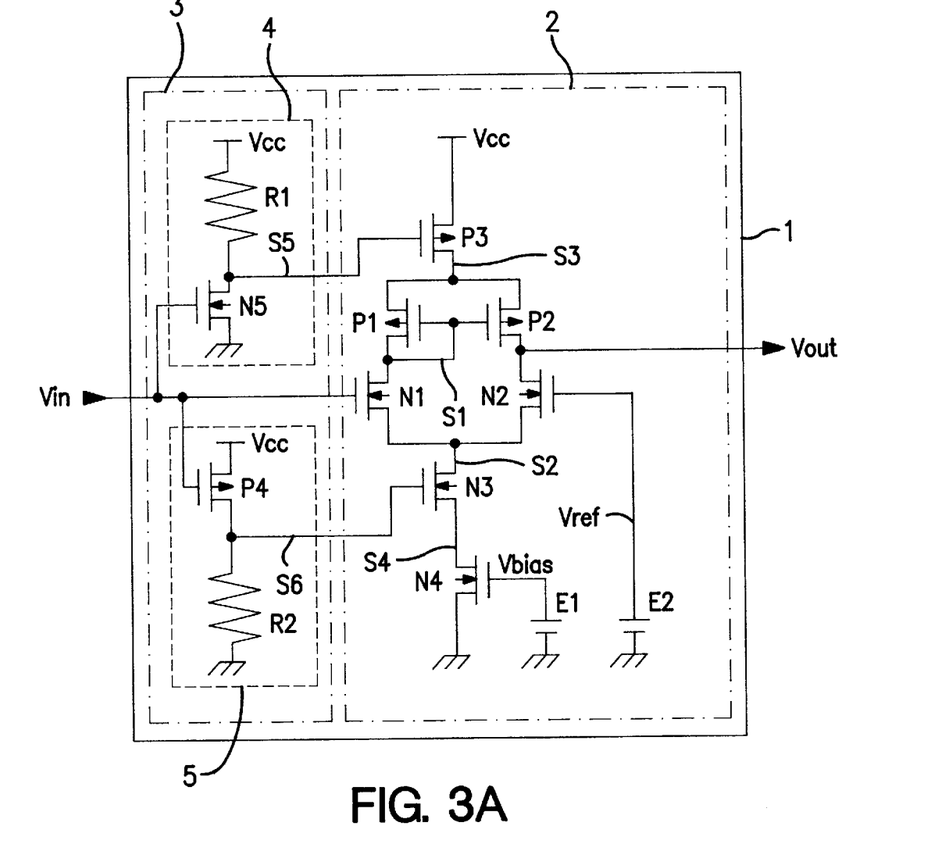
FIG. 3(a) is a circuit diagram of a first embodiment of an input first stage circuit of the present invention.

A first embodiment of an input first stage circuit according to the present invention includes a differential amplifier 2 for comparing an input signal Vin and a reference voltage Vref with each other and amplifying a difference between them to produce an output signal Vout, and a level detection circuit 3 for detecting whether or not the level of the input signal Vin supplied thereto is in a CMOS standby state to generate power supply disconnection signals S5 and S6 to switch the differential amplifier 2 between active and inactive states.

The present circuit has the following construction.

The differential amplifier 2 includes N-channel transistors (NMOS) N1 and N2 which form a differential pair, P-channel transistors (PMOS) P1 an P2 which form a current mirror circuit, power supply switching transistors P3 and N3 controlled by the power supply disconnection signals S5 and S6, respectively, different power supplies E1 and E2 for supplying a bias voltage Vbias and a reference voltage Vref for differential comparison, respectively, and an NMOS N4 controlled by the bias voltage Vbias from the dc power supply E1.

The level detection circuit 3 includes a low level THe standby detector 4 formed from a high resistor R1 and an NMOS N5, which receives the input signal Vin supplied to the gate thereof, connected in series between a power supply Vcc and the ground potential GND in order to generate the power supply disconnection signal S5, and a high level standby detector 5 formed from a high resistor R2 and a PMOS P4, which receives the input signal Vin supplied to the gate thereof, connected in series similarly in order to generate the power supply disconnection signal S6.

The level detection circuit 3 discriminates whether or not the level of the input signal Vin exhibits a CMOS standby state making use of a threshold voltage of a transistor, and generates the power supply disconnection signals S5 and S6 to interrupt the power supplied to the differential amplifier 2 when the input signal Vin exhibits a CMOS standby state.

Figure 3B:
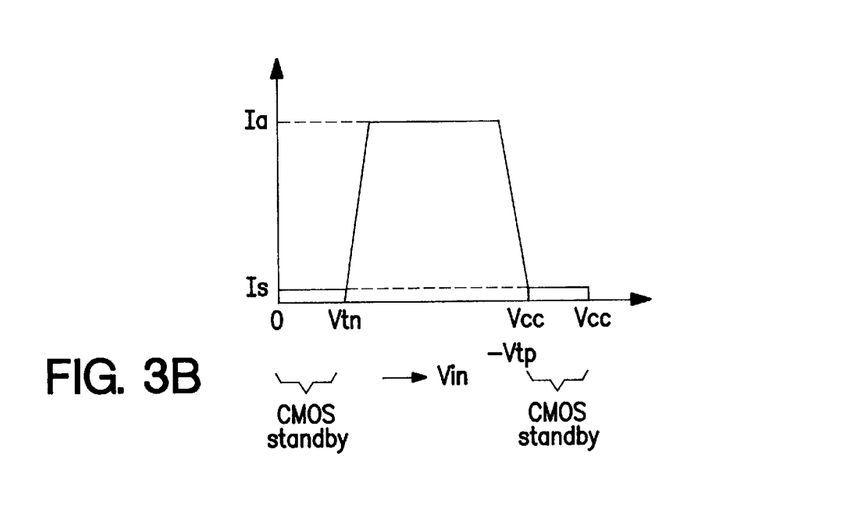
FIG. 3(b) is a diagram illustrating an input signal-current consumption characteristic of the input first stage circuit of FIG. 3(a)

The current consumption of the input first stage circuit 1 having the construction described above has such a characteristic as illustrated in FIG. 3(b). In particular, within a high level input period of the input signal Vin, that is, when the level of the input signal Vin is higher than a difference voltage value (Vcc−Vtp) of the threshold voltage Vtp of the PMOS from the power supply voltage Vcc but is equal to or lower than the power supply voltage Vcc, the current consumption of the input first stage circuit 1 exhibits a very low current Is for the power supply disconnection signals S5 and S6.

When the level of the input signal Vin is lower than (Vcc−Vtp) which is intermediate between the high level and the low level but is higher than the threshold voltage Vtn of the NMOS, a steady current Ia which is the sum of the very low current Is and the constant current is consumed.

On the other hand, within a low level input period of the input signal Vin, that is, when the level of the input signal Vin is higher than the ground potential GND but lower than the threshold voltage Vtn of the NMOS, the current consumption is the very low current Is for the power supply disconnection signals S5 and S6.

The operation described above will now be described in more detail. First, when the level of the input signal Vin has a high level which is higher than (Vcc−Vtp), the PMOS P4 of the high level standby detector 5 is in an off state, and the power supply disconnection signal S6 is controlled to the ground potential (GND) by the high resistor R2. Meanwhile, the NMOS N5 of the low level standby detector 4 is in an on state, and current sufficiently higher than the current supply by the high resistor R1 is supplied through the NMOS N5 to control the power supply disconnection signal S5 to the ground potential (GND). In this instance, since the PMOS P3 of the differential amplifier 2 is controlled to an on state and the NMOS N3 is controlled to an off state, the current to be consumed by the differential amplifier 2 is interrupted by the NMOS N3 and thus controlled to zero.

Accordingly, the current consumed by the input first stage circuit 1 is given by the current consumed only by the high level standby detector 5, and the current consumption in this instance is the very low current Is which depends upon the high resistor R2.

On the other hand, when the level of the input signal Vin is an intermediate level, that is, when the level of the input signal Vin is lower than (Vcc−Vtp) but higher than Vtn, the PMOS P4 of the high level standby detector 5 is in an on state, and current sufficiently higher than the current supply by the differential amplifier 2 is supplied to make the power supply disconnection signal S6 equal to the power supply voltage Vcc. Meanwhile, the NMOS N5 of the low level standby detector 4 exhibits an on state, and the power supply disconnection signal S5 is controlled to the ground potential GND as a result of supply of current sufficiently higher than the current supply by the high resistor R1. In this instance, since both the PMOS P3 and the NMOS N3 of the differential amplifier 2 exhibit an on state, the differential amplifier 2 outputs an output signal Vout corresponding to the level of the input signal Vin. In other words, if the level of the input signal Vin is higher than the reference voltage Vref, then the high level is outputted as the output signal Vout, but if the level of the input signal Vin is lower than the reference voltage Vref, then the low level is outputted as the output signal Vout.

The current consumption in this instance is a predetermined current value Ia (=steady current of Isx2+N4) which is the sum of a very low current Isx2 which in turn is the sum of two very low currents Is of the low level standby detector 4 and the high level standby detector 5 consumed in the level detection circuit 3 and a steady current of the NMOS N4 which performs a constant current source operation.

It is to be noted here that, while it is assumed that, for simplified description, R1=R2 and each very low current Is is substantially equal to Vcc/R1=Vcc/R2, the values of the high resistors R1 and R2 need not be equal to each other.

Next, when the level of the input signal Vin exhibits a low level lower than Vtn, the PMOS P4 of the high level standby detector 5 exhibits an on state, and current sufficiently higher than the current by the high resistor R2 is supplied so that the power supply disconnection signal S6 becomes equal to the value of the power supply voltage Vcc. Meanwhile, the NMOS N5 of the low level standby detector 4 is in an off state, and the power supply disconnection signal S5 is controlled to the value of the power supply voltage Vcc by the high resistor R1. The current consumed by the differential amplifier 2 in this instance is zero because, since the PMOS P3 is off and the NMOS N3 is on, the current supplied is interrupted by the PMOS P3.

Since the PMOS P3 and the NMOS N3 for switching are provided for the differential amplifier and the level detection circuit which detects a standby voltage level to generate the power supply disconnection signals S5 and S6 to control the PMOS P3 and the NMOS N3 is provided in the stage preceding to the PMOS P3 and the NMOS N3 in this manner, reduction of the current consumption and switching control between active and inactive can be realized simply.

Next, a second embodiment of the present invention is described.

Figure 4A:
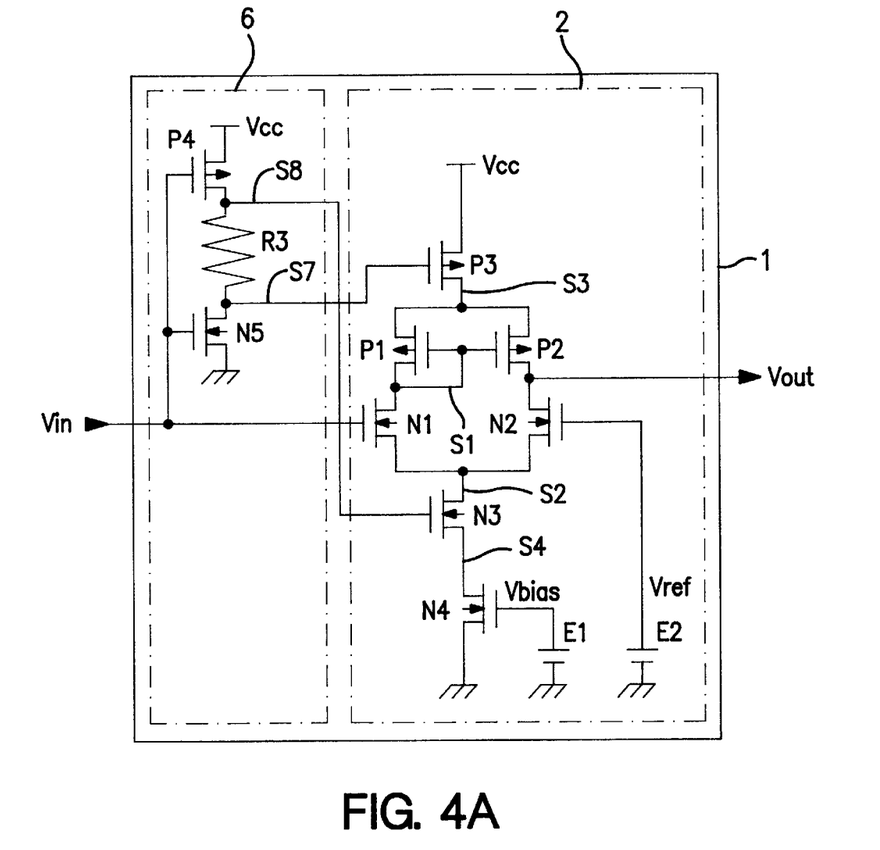
FIG. 4(a) is a circuit diagram of a second embodiment of an input first stage circuit of the present invention.
Figure 4B:
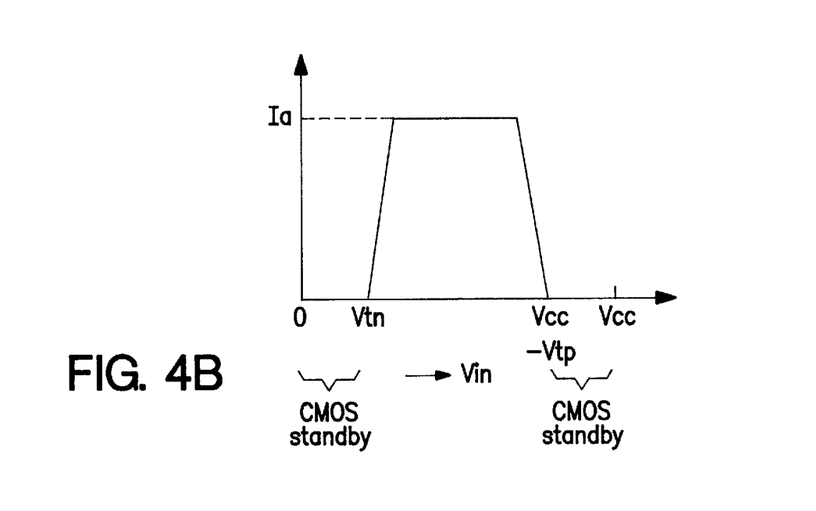
FIG. 4(b) is a diagram illustrating an input signal-current consumption characteristic of the input first stage circuit of FIG. 4(a)

Referring to FIG. 4(a), the present input first stage circuit 1 includes a differential amplifier 2, and a level detection circuit 6 for detecting whether or not the level of an input signal Vin is a level representative of a CMOS standby state to produce power supply disconnection signals S7 and S8 for switching the differential amplifier 2 between active and inactive. The level detection circuit 6 has a simplified construction compared with that of the level detection circuit 3 in the first embodiment and includes a PMOS P4, a high register R3 and an NMOS N5 connected in series between a power supply Vcc and the ground GND such that the power supply disconnection signals S7 and S8 may be extracted from the opposite ends of the high register R3. The input signal-current consumption characteristic of the present circuit 1 is, as seen in FIG. 4(b), substantially similar to but different from that of FIG. 3(b) in that the very low current Is is deleted.

Operation of the present circuit is described below.

First, when the level of the input signal Vin is higher than (Vcc−Vtp), the PMOS P4 of the level detection circuit 6 exhibits an off state and the NMOS N5 exhibits an on state. Consequently, the power supply disconnection signal S7 is controlled to GND, and also the power supply disconnection signal S8 is controlled to GND by the high register R3. Accordingly, although the operation in this instance is the same as that of the level detection circuit 3 described hereinabove, since the PMOS P4 is in an off state, the current consumption is reduced to zero.

When the level of the input signal Vin is lower than Vtn, since the PMOS P4 exhibits an on state and the NMOS N5 exhibits an off state, the power supply disconnection signal S8 is controlled to Vcc, and also the power supply disconnection signal S7 is controlled to Vcc by the high register R3. Thus, although the operation in this instance is also the same as that of the level detection circuit 3, since the NMOS N5 is in an off state, the current consumption is reduced to zero.

When the level of the input signal Vin is an intermediate level between (Vcc−Vtp) and Vtn, since both of the PMOS P4 and the NMOS N5 of the level detection circuit 6 exhibit an on state, the power supply disconnection signal S8 is controlled to Vcc by current flowing through the high register R3, and the power supply disconnection signal S7 is controlled to GND. Accordingly, although also the operation in this instance is the same as that of the level detection circuit 3, the current consumption in this instance is a predetermined current Ia which is the sum of a very low current flowing through the high register R3 and consumed by the level detection circuit 6 and a constant current consumed by the NMOS N4 of the differential amplifier 2 which performs a constant current source operation. In other words, since the PMOS P4 and the NMOS N5 exhibit an on state, the very low current does not become equal to zero, and if it is assumed that the resistances of the PMOS P4 and the NMOS N5 in an on state are sufficiently low, then the current consumption flowing through the level detection circuit 6 is substantially equal to Vcc/R3.

Where the simplified level detection circuit 6 which generates the power supply disconnection signals S7 and S8 is provided in the stage preceding to the differential amplifier 2 as in the present second embodiment, the current consumption can be further reduced and switching of the differential amplifier between active and inactive can be controlled simply.

Figure 5:
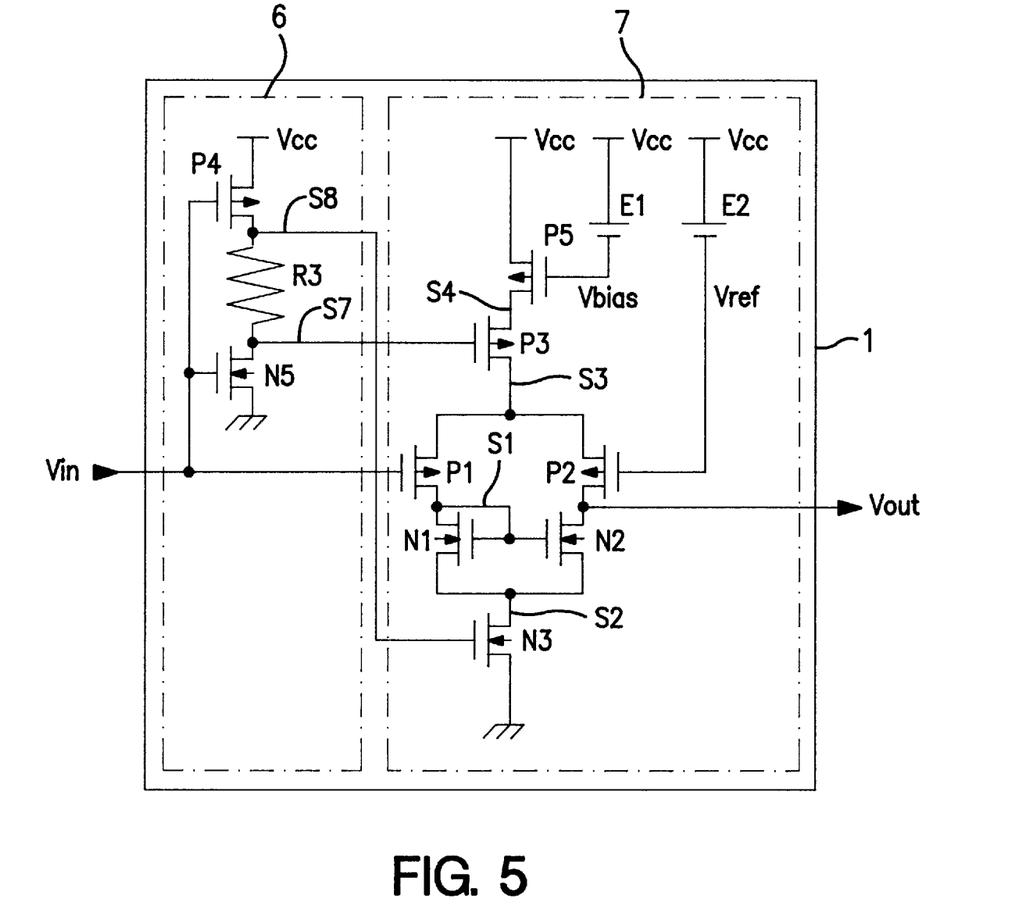
FIG. 5 is a circuit diagram of a third embodiment of an input first stage circuit of the present invention.

Next, a third embodiment which employs a level detection circuit 6 similar to that of the second embodiment and a differential amplifier 7 which is a modification to the differential amplifier 2 is described with reference to FIG. 5.

The differential amplifier 7 is constructed such that an input signal Vin and a reference voltage Vref are supplied to a PMOS P1 and a PMOS P2, respectively, and replaces the PMOS and the NMOS of the differential amplifier 2 in the second embodiment with each other.

First, when the input signal Vin has the high level, that is, when the input signal Vin has a level higher than (Vcc−Vtp), the power supply disconnection signals S7 and S8 of the level detection circuit 6 have the level of GND as described hereinabove. In this instance, since the PMOS P3 of the differential amplifier 7 exhibits an on state and the NMOS N3 exhibits an off state, current is interrupted by the NMOS N3 and the current consumption of the differential amplifier 7 is zero. Therefore, the level of the output voltage Vout is controlled to the high level by a route of the PMOS P5-P3-P2. Accordingly, no current is consumed by the input first stage circuit 1, and the current consumption is zero similarly as seen from FIG. 4(b).

When the level of the input signal Vin has an intermediate level, that is, when the level of the input signal Vin has a level between (Vcc−Vtp) and Vtn, the power supply disconnection signal S7 of the level detection circuit 6 has the level of GND and the power supply disconnection signal S8 has the level of Vcc. In this instance, since both of the PMOS P3 and the NMOS N3 of the differential amplifier 7 are in an on state, the differential amplifier 7 outputs an output signal Vout in response to the level of the input signal Vin. In particular, if the level of the input signal Vin is higher than the reference voltage Vref, then the output signal Vout exhibits the high level, but if the level of the input signal Vin is lower than the reference voltage Vref, then the output signal Vout exhibits the low level. Consequently, the current consumption is a predetermined current value Ia which is the sum of a very low current consumed by the high register R3 of the level detection circuit 6 and a steady current for a constant current operation of the PMOS P5 similarly as seen in FIG. 4(b).

Since the present third embodiment merely replaces the PMOS and the NMOS which form the differential amplifier in the second embodiment, a result similar to that of the second embodiment is obtained.

Figure 6:
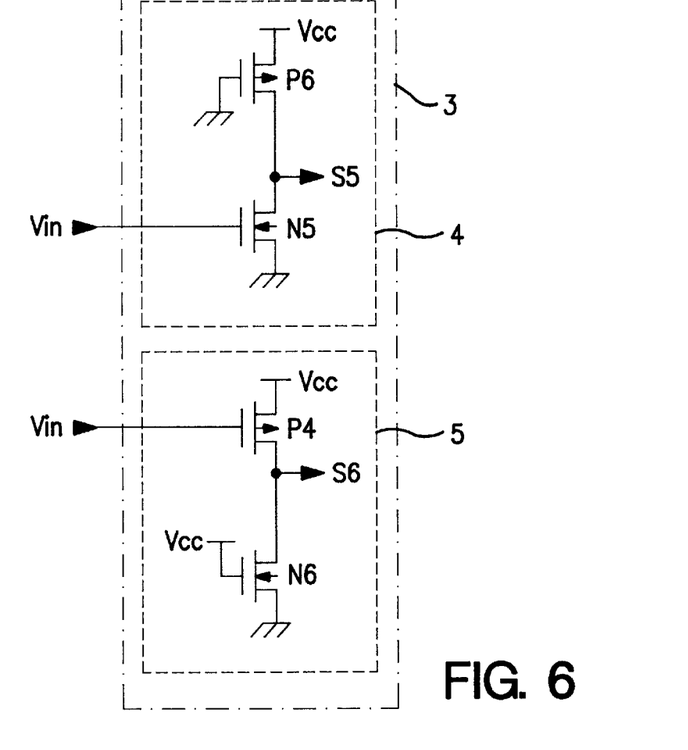
FIG. 6 is a circuit diagram of a level detection circuit of a fourth embodiment of an input first stage circuit of the present invention.

Next, a fourth embodiment wherein the level detection circuit 3 in the first embodiment is modified is described with reference to FIG. 6.

The present level detection circuit 3 includes modifications to the low level standby detector 4 and the high level standby detector 5 in the first embodiment and employs a PMOS P6 and an NMOS N6 which receive GND and Vcc supplied to the gates thereof in place of the high resistor R1 and R2, respectively. For the PMOS P6 and the NMOS N6, transistors having a small current capacity similar to those of the high resistors R1 and R2 is used.

In the present level detection circuit 3, when the input signal Vin has the high level higher than (Vcc−Vtp), since the PMOS P4 of the high level standby detector 5 exhibits an off state, the power supply disconnection signal S6 is controlled to GND by the NMOS N6. Meanwhile, since the NMOS N5 of the low level standby detector 4 exhibits an on state, current sufficiently higher than the current from the PMOS P6 is supplied, and consequently, the power supply disconnection signal S5 is controlled to GND. The current consumption in this instance is given only by the very low current Is which depends upon the PMOS P6 similarly as seen from FIG. 3(b).

On the other hand, when the input signal Vin has a low level lower than Vtn, since the PMOS P4 of the high level standby detector 5 exhibits an on state, current sufficiently higher than the current from the NMOS N6 is supplied so that the power supply disconnection signal S6 is controlled to Vcc. Meanwhile, since the NMOS N5 of the low level standby detector 4 exhibits an off state, the power supply disconnection signal S5 is controlled to Vcc by the PMOS P6. The current consumption in this instance is given by only the very low current Is which depends upon the NMOS N6 similarly as seen from FIG. 3(b).

Further, when the level of the input signal Vin is an intermediate level, that is, when the level of the input signal Vin is between (Vcc−Vtp) and Vtn, since the PMOS P4 of the high level standby detector 5 exhibits an on state, the power supply disconnection signal S6 is controlled to Vcc. Meanwhile, since the NMOS N5 of the low level standby detector 4 exhibits an on state, the power supply disconnection signal S5 is controlled to GND. The current consumption in this instance is a predetermined current value Ia which is the sum of a very low current Isx2 consumed by the level detection circuit 3 and a steady current of the NMOS N4 for a constant current source operation, similarly as seen from FIG. 3(b).

Figure 7:
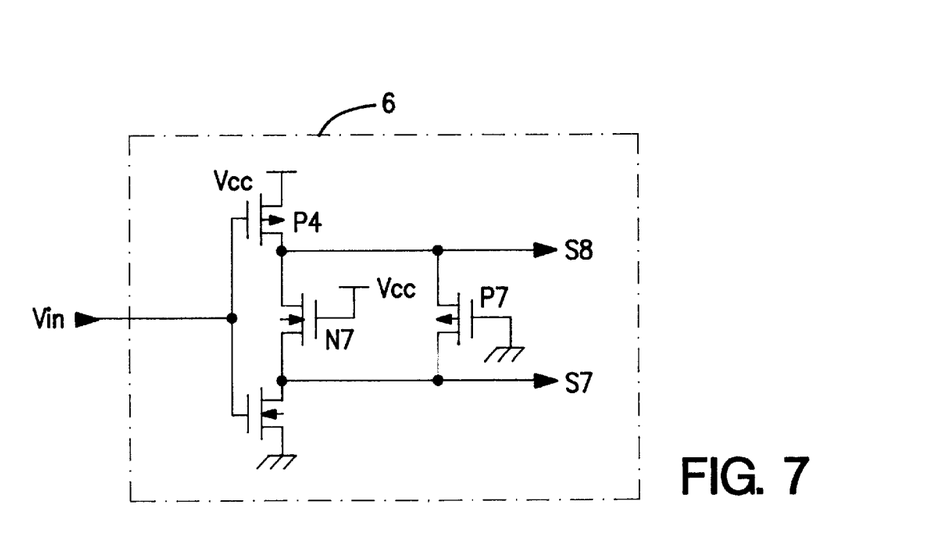
FIG. 7 is a circuit diagram of a level detection circuit of a fifth embodiment of an input first stage circuit of the present invention.

Next, a fifth embodiment of the present invention is described with reference to FIG. 7.

The fifth embodiment is a modification to the level detection circuit 6 in the second embodiment and includes, in place of the high register R3, an NMOS N7 and a PMOS P7 which receive Vcc and GND supplied to the gates thereof, respectively. For the NMOS N7 and the PMOS P7, transistors having a low current capacitance are used similarly to the high register R3.

Also in the present level detection circuit 6, when the input signal Vin has the high level, that is, when the input signal Vin is higher than (Vcc−Vtp), since the PMOS P4 of the level detection circuit 6 exhibits an off state and the NMOS N5 exhibits an on state, the power supply disconnection signal S7 is controlled to GND, and also the power supply disconnection signal S8 is controlled to GND by the NMOS N7. Accordingly, operation of the level detection circuit 6 is also similar to that of the level detection circuit 6 in the second embodiment. The current consumption in this instance is zero similarly as seen in FIG. 4(b) since the PMOS P4 is off.

When the input signal Vin has the low level, that is, when the input signal Vin is lower than Vtn, since the PMOS P4 of the level detection circuit 6 exhibits an on state and the NMOS N5 exhibits an off state, the power supply disconnection signal S8 is controlled to Vcc, and the power supply disconnection signal S7 is controlled to Vcc by the PMOS P7. Consequently, the level detection circuit 6 performs the same operation as that of the level detection circuit 6 in the second embodiment. The current consumption in this instance is zero similarly as seen in FIG. 4(b) since the NMOS N5 is in an off state.

When the level of the input signal Vin is an intermediate level, that is, when the level of the input signal Vin is higher than (Vcc−Vtp) but lower than Vtn, both of the PMOS P4 and the NMOS N5 of the level detection circuit 6 exhibit an on state. Accordingly, the current supplies of the PMOS P7 and the NMOS N7 cancel each other, and the power supply disconnection signal S8 is controlled to Vcc while the power supply disconnection signal S7 is controlled to GND. Consequently, the level detection circuit 6 operates similarly to the detection circuit in the second embodiment. The current consumption in this instance is a predetermined current value Ia which is the sum of the very low current consumed by the PMOS P7 and the NMOS N7 of the level detection circuit 6 and the steady current of the NMOS N4 of the differential amplifier 2 similarly as seen from FIG. 4(b).

It is to be understood that variations and modifications of the "input first stage circuit for a semiconductor device" disclosed herein will be evident to those skilled in the art. It is intended that all such modifications and variations be included within the scope of the appended claims.

What is claimed is:

1. An input first stage circuit for a semiconductor device comprising:
 a differential amplifier for comparing an input signal with a reference voltage and amplifying a voltage difference between the input signal and the reference voltage; and
 a level detection circuit for detecting either of two predetermined voltage levels of the input signal to responsively produce one of two power supply disconnection signals for said differential amplifier,
 said level detection circuit comprising:
  low level standby detector for detecting a low level of the input signal and producing a first of said two power supply disconnection signals,
  a high level standby detector for detecting a high level of the input signal and producing a second of said two power supply disconnection signals,
  said standby detectors each comprising an input stage transistor to which the input signal is inputted, and produces one of said two power supply disconnection signals in accordance with a voltage value which depends upon a threshold voltage of said input stare transistor;
  wherein power supplied to said differential amplifier is stopped while said level detection circuit produces either of the two power supply disconnection signals.

2. An input first stage circuit for a semiconductor device as claimed in claim 1, wherein said differential amplifier comprises differential pair transistors for comparing the input signal with the reference voltage and two switching transistors for receiving the respective power supply disconnection signal to control the power being supplied, wherein said differential amplifier is switched between active and inactive based on the input signal.

3. An input first stage circuit as claimed in claim 1, wherein said differential amplifier is composed of a pair of transistors comprising a PMOS transistor which receives the input signal supplied to the gate thereof and another PMOS transistor which receives the reference voltage supplied to the gate thereof.

4. An input first stage circuit for a semiconductor device comprising:
 a differential amplifier for comparing an input signal with a reference voltage and amplifying a voltage difference between the input signal and the reference voltage,
 and a level detection circuit for detecting either of two predetermined voltage levels of the input signal to produce one of two power supply disconnection signals for said differential amplifier,
 wherein power supplied to said differential amplifier is stopped while said level detection circuit produces said one of the power supply disconnection signals wherein,
 said differential amplifier comprises a pair of N-channel MOS transistors (NMOS) which form a differential pair, a pair of P-channel MOS transistors (PMOS) which form a current mirror circuit, a pair of power supply switching transistors controlled by the respective power supply disconnection signal, a dc power supply for supplying a bias voltage, another NMOS transistor controlled by said dc power supply, and another dc power supply for supplying the reference voltage for the differential comparison;
 the two power supply disconnection signals comprising a first power supply disconnection signal and a second power supply disconnection signal;
 said level detection circuit comprises a low level standby detector for detecting a low level of the input signal, and a high level standby detector for detecting a high level of the input signal;
 said low level standby detector comprises an input stage transistor to which the input signal is inputted, and produces the first power supply disconnection signal to be sent to one of said power supply switching transistors of said differential amplifier when the detected level of the input signal is a low level lower than the threshold voltage of said input stage transistor of said low level standby detector; and said high level standby detector comprises an input stage transistor to which the input signal is inputted and produces the second power supply disconnection signal to be sent to the other power supply switching transistor of said differential amplifier when the detected level of the input signal is a high level higher than the level of a Vcc power supply voltage minus the threshold voltage of said input stage transistor of said high level standby detector.

5. An input first stage circuit as claimed in claim 4, wherein said input stage transistor of said low level standby detector comprises an NMOS transistor which receives the input signal supplied to the gate thereof and said low level standby detector further comprises a high resistor connected in series to said NMOS transistor between said Vcc power supply voltage and ground, and said input stage transistor of said high level standby detector comprises a PMOS transistor which receives the input signal supplied to the gate thereof and said high level standby detector further comprises another high resistor connected in series to said PMOS transistor between said Vcc power supply voltage and the ground.

6. An input first stage circuit as claimed in claim 4, wherein said level detection circuit includes a PMOS transistor, a high resistor and an NMOS transistor connected in series between said Vcc power supply voltage and ground such that said first and second power supply disconnection signals are extracted from the opposite ends of said high resistor.

7. An input first stage circuit as claimed in claim 6, wherein said high resistor of said level detection circuit is composed of a PMOS transistor of a low current capacity which receives ground voltage supplied to the gate thereof, and an NMOS transistor of a low current capacity which receives said Vcc power supply voltage supplied to the gate thereof.

* * * * *